(12) United States Patent
Ulicny et al.

(10) Patent No.: US 6,742,227 B2
(45) Date of Patent: Jun. 1, 2004

(54) RELEASABLE FASTENER SYSTEM AND PROCESS

(75) Inventors: John C. Ulicny, Oxford, MI (US); Mark A. Golden, Washington, MI (US)

(73) Assignee: General Motors Corporation, Detroit, MI (US)

( * ) Notice: Subject to any disclaimer, the term of this patent is extended or adjusted under 35 U.S.C. 154(b) by 0 days.

(21) Appl. No.: 10/305,424

(22) Filed: Nov. 26, 2002

(65) Prior Publication Data

US 2004/0074066 A1 Apr. 22, 2004

Related U.S. Application Data

(63) Continuation-in-part of application No. 10/273,691, filed on Oct. 19, 2002.

(51) Int. Cl.[7] .......................... A44B 18/00; A44B 21/00; B32B 3/06
(52) U.S. Cl. .............. 24/442; 24/303; 24/304; 24/446; 24/452; 24/606; 428/100
(58) Field of Search .......................... 24/442, 446, 450, 24/451, 452, 448, 304, 303, 66.1, 606; 428/100

(56) References Cited

U.S. PATENT DOCUMENTS

| | | | | |
|---|---|---|---|---|
| 3,469,289 A | * | 9/1969 | Whitacre .................... 24/450 |
| 4,775,310 A | | 10/1988 | Fischer ....................... 425/308 |
| 5,725,928 A | * | 3/1998 | Kenney et al. .............. 428/100 |
| 5,945,193 A | * | 8/1999 | Pollard et al. .............. 428/100 |
| 5,979,744 A | * | 11/1999 | Brigleb ..................... 229/87.01 |
| 6,086,599 A | | 7/2000 | Lee et al. .................... 606/108 |
| 6,129,970 A | * | 10/2000 | Kenney et al. .............. 428/100 |
| 6,546,602 B1 | * | 4/2003 | Eipper et al. ............... 224/442 |
| 6,598,274 B1 | * | 7/2003 | Marmaropoulos ........... 24/451 |

FOREIGN PATENT DOCUMENTS

WO    WO 01/84002    11/2001

* cited by examiner

*Primary Examiner*—Victor Sakran
(74) *Attorney, Agent, or Firm*—Kathryn A. Marra

(57) ABSTRACT

A releasable fastener system comprises a loop portion and a hook portion. The loop portion includes a support and a loop material disposed on one side thereof whereas the hook portion includes a support and a plurality of closely spaced upstanding hook elements extending from one side thereof. When the hook portion and loop portion are pressed together they interlock to form a releasable engagement. The resulting joint created by the engagement is relatively resistant to shear and pull forces and weak in peel strength forces. The hook elements comprise a magnetic material that provides a change in shape orientation of the hook elements in response to an activation signal. In this manner, the shape orientation of the hook elements can be remotely changed to provide a reduction or magnification in the shear and/or pull-off forces.

20 Claims, 5 Drawing Sheets

MAGNETIC FIELD OFF

MAGNETIC FIELD OFF

MAGNETIC FIELD ON

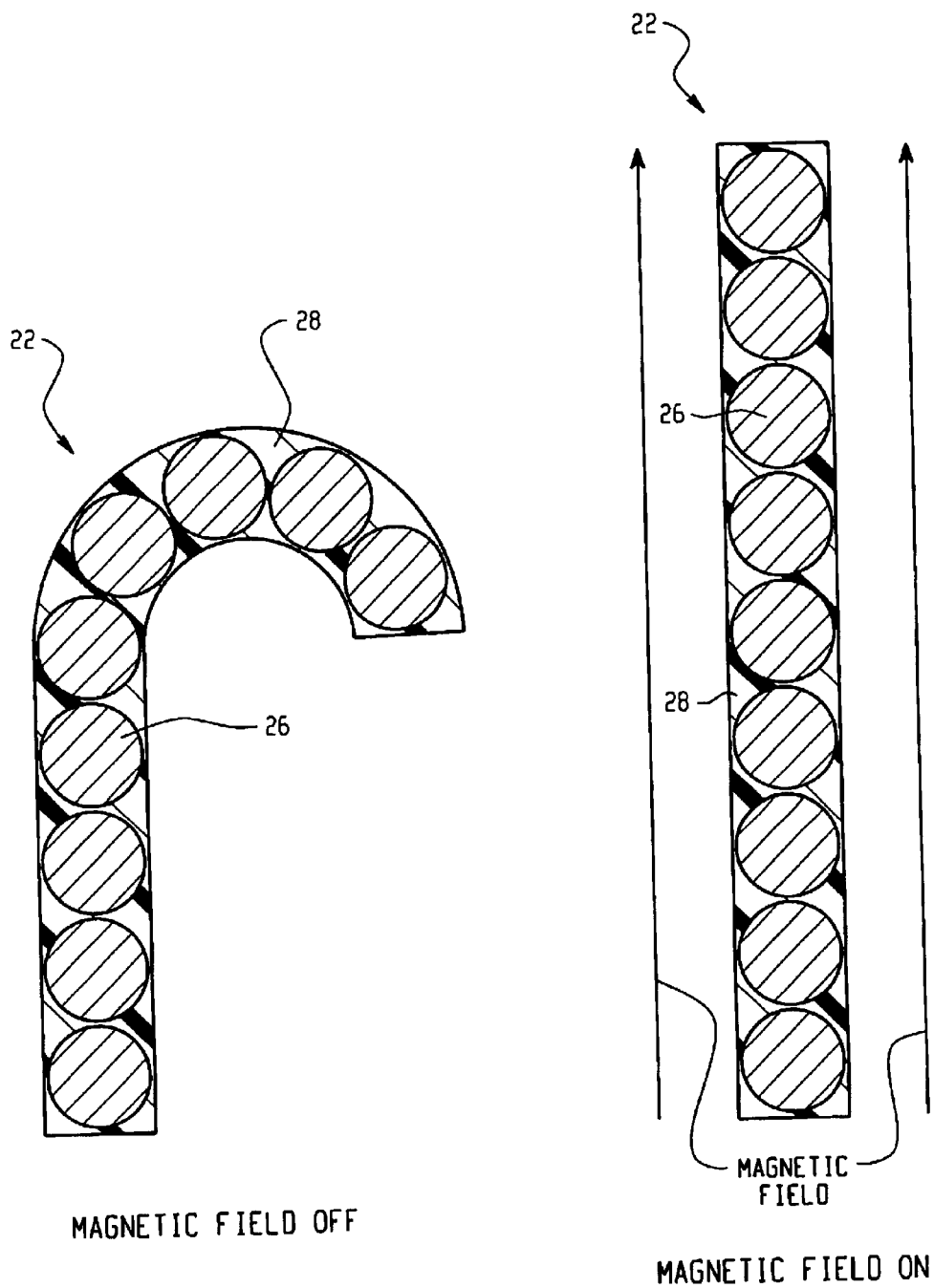

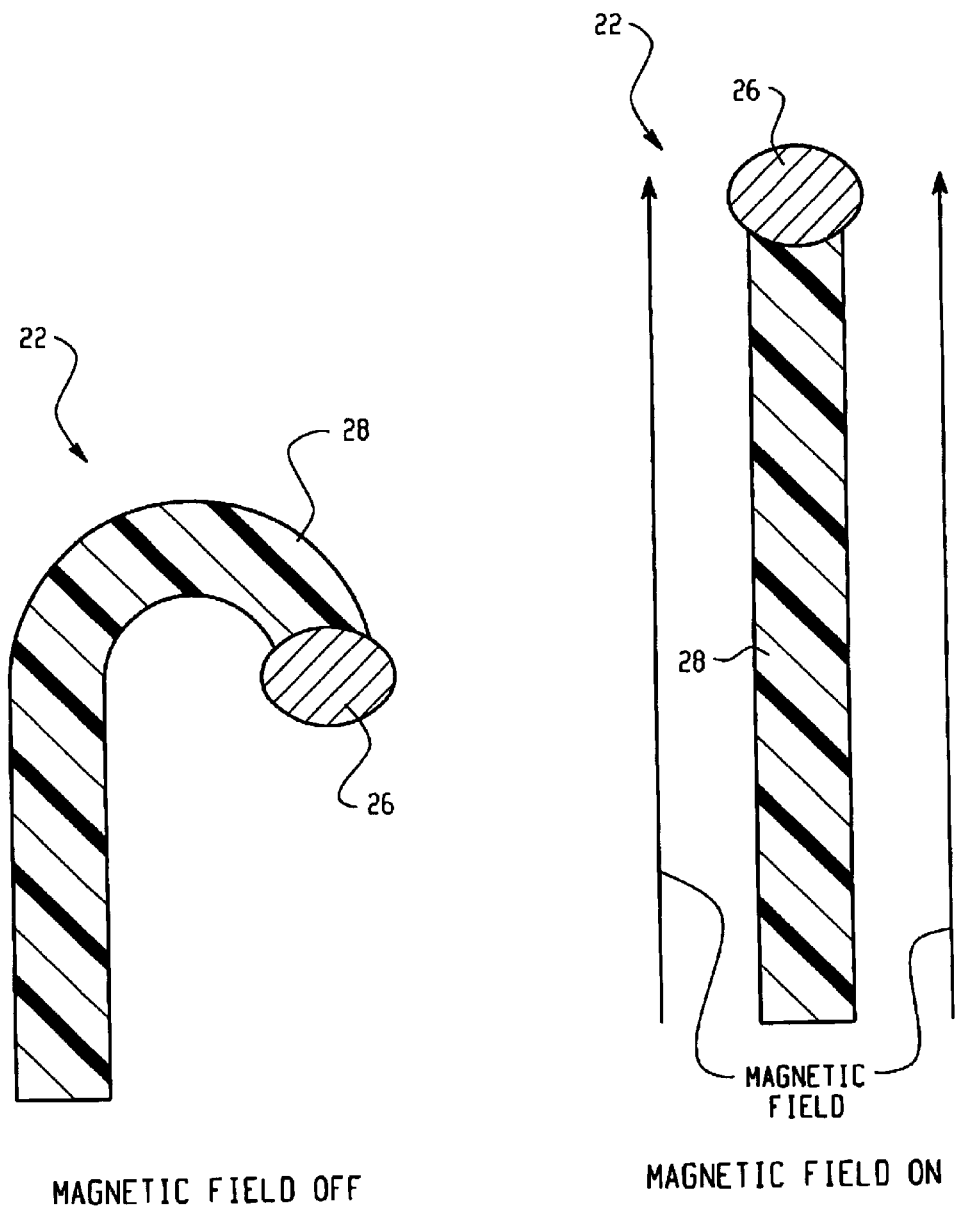

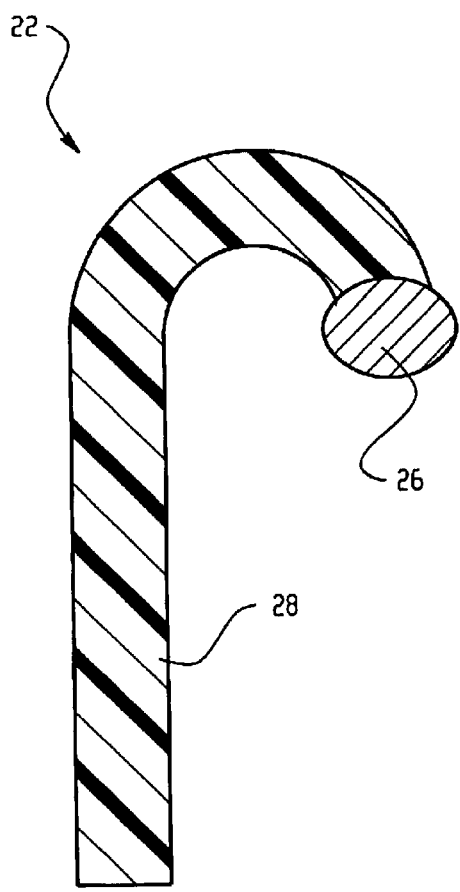
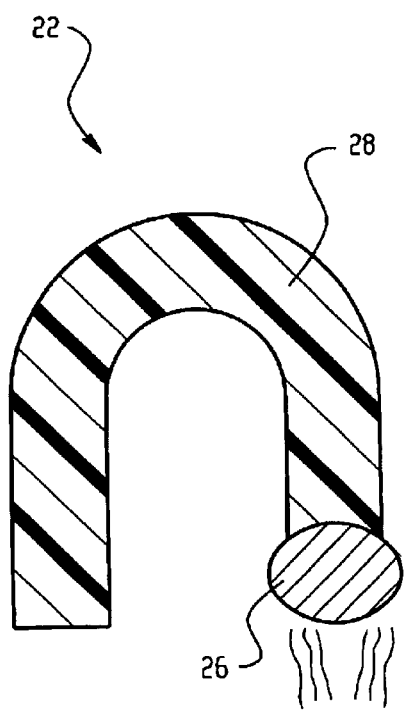
MAGNETIC FIELD OFF
Fig. 7A
MAGNETIC FIELD ON
Fig. 7B

RELEASABLE FASTENER SYSTEM AND PROCESS

CROSS-REFERENCE TO RELATED APPLICATIONS

This application is a Continuation in Part of U.S. application Ser. No. 10/273,691 filed Oct. 19, 2002, which is incorporated by reference herein in its entirety.

BACKGROUND

This disclosure relates to releasable attachment devices of the type used to fasten, retain, or latch together components of an apparatus or a structure that are to be separated or released under controlled conditions.

Hook and loop type separable fasteners are well known and are used to join two members detachably to each other. These types of fasteners generally have two components disposed on opposing member surfaces. One component typically includes a plurality of resilient hooks while the other component typically includes a plurality of loops. When the two components are pressed together they interlock to form a releasable engagement. The resulting joint created by the engagement is relatively resistant to shear and pull forces, and weak in peel strength forces. As such, peeling one component from the other component can be used to separate the components with a minimal applied force. As used herein, the term "shear" refers to an action or stress resulting from applied forces that causes or tends to cause two contiguous parts of a body to slide relatively to each other in a direction parallel to their plane of contact. The term "pull force" refers to an action or stress resulting from applied forces that causes or tends to cause two contiguous parts of a body to move relative to each other in a direction perpendicular to their plane of contact.

Magnetorheological (MR) fluids and elastomers are known as "smart" materials whose rheological properties can rapidly change upon application of a magnetic field. MR fluids are suspensions of micrometer-sized, magnetically polarizable particles in oil or other liquids. When a MR fluid is exposed to a magnetic field, the normally randomly oriented particles form chains of particles in the direction of the magnetic field lines (FIG. 1). The particle chains increase the apparent viscosity (flow resistance) of the fluid. The stiffness of the structure is accomplished by changing the shear and compression/tension moduli of the MR fluid by varying the strength of the applied magnetic field. The MR fluids typically develop structure when exposed to a magnetic field in as little as a few milliseconds. Discontinuing the exposure of the MR fluid to the magnetic field reverses the process and the fluid returns to a lower viscosity state. MR fluids enclosed in structural elements have been disclosed in U.S. Pat. No. 5,547,049.

BRIEF SUMMARY

Disclosed herein is a releasable fastener system that provides for a controlled release or separation of a joint in a shear and/or pull-off direction. A releasable fastener system comprises a loop portion comprising a support and a loop material disposed on a surface thereon; a hook portion comprising a support and a plurality of hook elements disposed on a surface, wherein the plurality of hook elements comprise a material adapted to change a shape orientation of the hook elements upon receipt of a magnetic signal; and an activation device coupled to the plurality of hook elements, the activation device being operable to selectively provide the magnetic signal to the hook elements and effectuate a change in the shape orientation of the hook elements to reduce or increase a shear force and/or a pull-off force.

In one embodiment, a releasable fastener system comprises hook elements comprised from a magnetic material, a magnetorheological fluid, a magnetorheological elastomer, and the like.

A process for operating a releasable fastener system comprises contacting a loop portion to a hook portion to form a releasable engagement, wherein the loop portion comprises a support and a loop material disposed on a surface thereon, and wherein the hook portion comprises a support and a plurality of hook elements disposed on a surface, wherein the plurality of hook elements comprises a material adapted to change a shape orientation upon receipt of an magnetic signal; maintaining constant shear and pull-off forces in the releasable engagement; selectively introducing the magnetic signal to the hook elements, wherein the magnetic signal is effective to change a shape orientation; and reducing shear and/or pull off forces in the releasable engagement.

A hook portion for a releasable fastener system comprises a support and a plurality of hook elements disposed on a surface of the support, wherein the plurality of hook elements comprise a material adapted to change a shape orientation upon receipt of a magnetic signal.

The above described and other features are exemplified by the following figures and detailed description.

BRIEF DESCRIPTION OF THE DRAWINGS

Referring now to the figures, which are exemplary embodiments and wherein the like elements are numbered alike:

FIG. 5 shows a cross sectional view of a hook element for use in the releasable fastener system;

FIG. 6 shows a cross sectional view of a hook element with a magnetic material disposed at an end of the hook element, wherein a shape orientation of the hook element is in an engaged and a disengaged position; and FIG. 7 shows a cross sectional view of a hook element, wherein a shape orientation of the hook element in an engaged and disengaged position is in accordance with another embodiment.

DETAILED DESCRIPTION

Figure 1A:
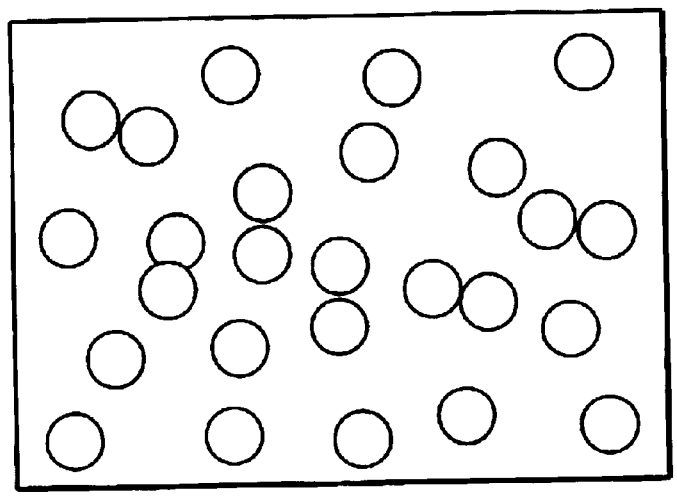
FIG. 1 is a schematic of a magnetic particle behavior in a magnetorheological (MR) fluid.
Figure 1B:
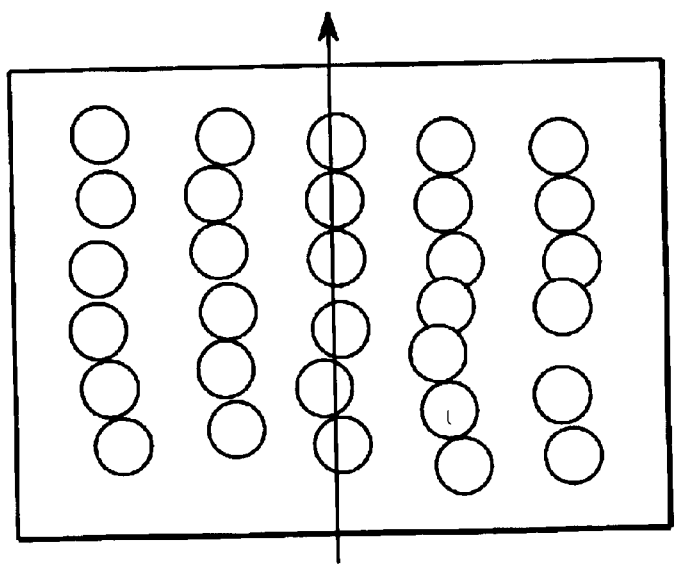
Figure 2:
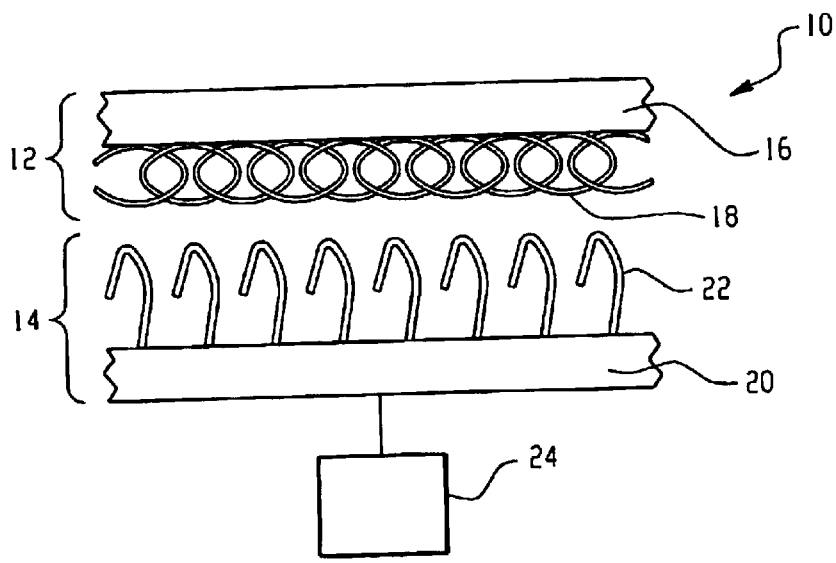
FIG. 2 shows a cross sectional view of a releasable fastener system.
Figure 3:
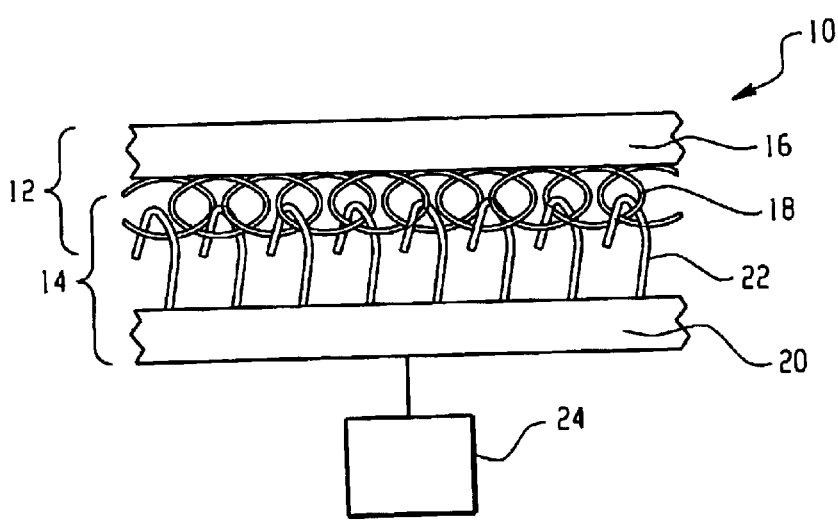
FIG. 3 shows a cross sectional view of the releasable fastener system of FIG. 2 in an engaged position.
Figure 4:
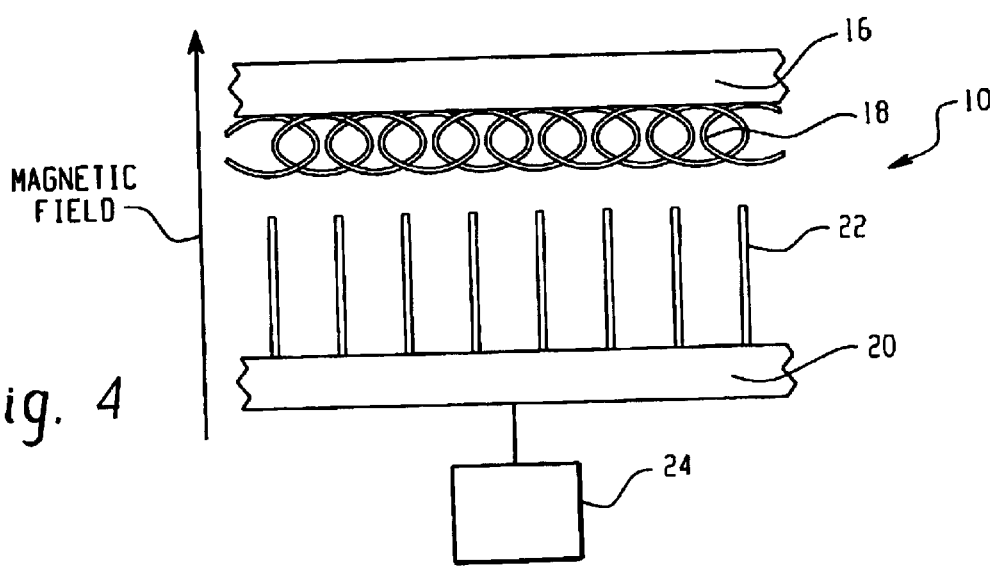
FIG. 4 shows a cross sectional view of the releasable fastener system of FIG. 2 in a disengaged position.

As shown in FIGS. 2–4, a releasable fastener system, generally indicated as 10, comprises a loop portion 12 and a hook portion 14. The loop portion 12 includes a support 16 and a loop material 18 disposed on one side thereof whereas the hook portion 14 includes a support 20 and a plurality of closely spaced upstanding hook elements 22 extending from one side thereof. The hook elements 22 are formed of a material that provides a shape changing capability to the hook elements 22 as will be described in greater detail. Preferably, the hook elements 22 employed are resilient and flexible in addition to having shape-changing capabilities. Coupled to and in operative communication with the hook elements 22 is an activation device 24. The activation device 24, on demand, provides an activation signal to the hook elements 22 to change the shape orientation of the hook elements 22. In a preferred embodiment, the activation signal provided by activation device 24 for changing the shape orientation of the hook elements 22 is a magnetic signal. The change in shape orientation property generally remains for the duration of the applied activation signal. Upon discontinuation of the activation signal, the hook elements 22 revert substantially to a relaxed or unpowered shape. The illustrated releasable fastener system 10 is exemplary only and is not intended to be limited to any particular shape, size, configuration, number or shape of hook elements 22, shape of loop material 18, or the like.

During engagement as shown more clearly in FIG. 3, the two portions 12 and 14 are pressed together to create a joint that is relatively strong in shear and pull-off directions, and weak in a peel direction. For example, when the two portions 12 and 14 are pressed into face-to-face engagement, the hook elements 22 become engaged with the loop material 18 and the close spacing of the hook elements 22 resists substantial lateral movement when subjected to shearing forces in the plane of engagement. Similarly, when the engaged joint is subjected to a force perpendicular to this plane, (i.e., pull-off forces), the hook elements 22 resist substantial separation of the two portions 12 and 14. However, when the hook elements 22 are subjected to a peeling force, the hook elements 22 can become disengaged from the loop material 18. It should be noted that separating the two portions 12 and 14 using the peeling force generally requires that one or both of the supports forming the hook portion and loop portion be flexible.

To reduce shear and pull-off forces resulting from the engagement, the shape orientation of the hook elements 22 is altered upon receipt of the activation signal from the activation device 24 to provide a remote releasing mechanism of the engaged joint as shown in FIG. 4. As a result of changing the shape orientation of the hook elements 22, a marked reduction in shear and pull off forces is observed, thereby allowing the joint to separate in directions normally associated with pull-off and shear. That is, the change in shape orientation reduces the shearing forces in the plane of engagement, and reduces the pull off forces perpendicular to the plane of engagement. For example, as shown in FIGS. 2 and 3, the plurality of hook elements 22 can have inverted J-shaped orientations that are changed, upon demand, to substantially straightened shape orientations upon receiving the magnetic signal from the activation device 24. As shown in FIG. 4, an arrow indicates the direction of the magnetic field produced by application of the magnetic signal. The substantially straightened shape relative to the J-shaped orientation provides the joint with marked reductions in shear and pull-off forces.

The hook elements 22 may be formed integrally with support 20, or more preferably, may be fixedly attached to the support 20. In practice, spacing between adjacent hook elements 22 is an amount effective to provide sufficient shear and pull off resistance desired for the particular application during engagement with the loop material 18. Depending on the desired application, the amount of shear and pull-off force required for effective engagement can vary significantly. Generally, the closer the spacing and the greater the number of hook elements 22 employed will result in increased shear and pull off forces upon engagement. The hook elements 22 preferably have a shape configured to become engaged with the loop material 18 upon pressing contact of the loop portion 12 with the hook portion 14, and vice versa. In this engaged mode, the hook elements 22 can have an inverted J-shaped orientation, an inverted L-shape, a mushroom shape, a knob shape, a multi-tined anchor, T-shape, spirals, or any other mechanical form of a hook-like element used for separable hook and loop fasteners. Such elements are referred to herein as "hook-like", "hook-type", or "hook" elements whether or not they are in the shape of a hook. Likewise, the loop material may comprise a plurality of loops or pile, a shape complementary to the hook element (e.g., a key and lock type engagement), or any other mechanical form of a loop-like element used for separable hook and loop fasteners.

FIG. 5 illustrates an exemplary hook element 22. The exemplary hook element 22 comprises a magnetic material 26 disposed within a polymer matrix 28 or optionally, may comprise a magnetic material 26 disposed in a liquid carrier (e.g., an MR fluid). In the case where the magnetic material is disposed in a carrier liquid, the hook elements preferably comprise a hollow tubular structural element, wherein the magnetic fluid is disposed. In the unpowered state, the hook element 22 preferably has a hook-like shape suitable for engagement with the loop material 18. Applying a magnetic signal to the hook element 22 causes the hook element to change shape to a substantially straightened shape orientation, i.e., a shape suitable for reducing the shear and pull off forces associated with the engagement of the hook portion with the loop portion. The structural element is preferably fabricated from a material that is resilient, flexible, and can withstand repetitive cycling of shape change orientations.

Referring now to FIG. 6, in one embodiment, the hook portion 14 comprises a magnetic material 26 at a tip, i.e., a distal end, of each hook element 22. In operation, a magnetic field causes the hook element to assume a substantially straightened shape orientation, thereby reducing the shear and/or pull off forces of an engaged hook and loop portion.

Alternatively, as shown in FIG. 7, the applied magnetic signal increases a shear force and/or a pull-off force. The system is "locked" for the duration of the magnetic signal by changing the shape orientation of the hooks to increase the shear force and/or a pull-off force relative to the relaxed position of the hooks. In the non-limiting example depicted in FIG. 7, an inverted J-shaped hook element 22 changes its shape orientation to an inverted U-shaped hook ("locked") upon receipt of the magnetic signal.

Suitable materials for providing the shape changing capability to the hook elements 22 include, but are not limited to, magnetic materials, magnetorheological fluids, magnetorheological elastomers, ferrofluids, colloidal magnetic fluids, and the like.

Suitable magnetic materials include, but are not intended to be limited to, soft or hard magnets, hematite, magnetite, magnetic material based on iron, nickel, and cobalt, alloys of the foregoing, or combinations comprising at least one of the foregoing, and the like. Alloys of iron, nickel and/or cobalt, can comprise aluminum, silicon, cobalt, nickel, vanadium, molybdenum, chromium, tungsten, manganese and/or copper.

Suitable MR fluid materials include, but are not intended to be limited to, ferromagnetic or paramagnetic particles dispersed in a carrier fluid. Suitable particles include iron; iron alloys, such as those including aluminum, silicon, cobalt, nickel, vanadium, molybdenum, chromium, tungsten, manganese and/or copper, iron oxides, including $Fe_2O_3$ and $Fe_3O_4$; iron nitride; iron carbide; carbonyl iron; nickel and alloys of nickel; cobalt and alloys of cobalt; chromium dioxide; stainless steel; silicon steel; and the like. Examples of suitable particles include straight iron powders, reduced iron powders, iron oxide powder/straight iron powder mixtures and iron oxide powder/reduced iron powder mixtures. A preferred magnetic-responsive particulate is carbonyl iron, preferably, reduced carbonyl iron.

The particle size should be selected so that the particles exhibit multi-domain characteristics when subjected to a magnetic field. Diameter sizes for the particles can be less than or equal to about 1,000 micrometers, with less than or equal to about 500 micrometers preferred, and less than or equal to about 100 micrometers more preferred. Also preferred is a particle diameter of greater than or equal to about 0.1 micrometer, with greater than or equal to about 0.5 more preferred, and greater than or equal to about 10 micrometer especially preferred. The particles are preferably present in an amount between about 5.0 and about 50 percent by volume of the total composition.

Suitable carrier fluids include organic liquids, especially non-polar organic liquids. Examples include, but are not limited to, silicone oils; mineral oils; paraffin oils; silicone copolymers; white oils; hydraulic oils; transformer oils; halogenated organic liquids, such as chlorinated hydrocarbons, halogenated paraffins, perfluorinated polyethers and fluorinated hydrocarbons; diesters; polyoxyalkylenes; fluorinated silicones; cyanoalkyl siloxanes; glycols; synthetic hydrocarbon oils, including both unsaturated and saturated; and combinations comprising at least one of the foregoing fluids.

The viscosity of the carrier component can be less than or equal to about 100,000 centipoise, with less than or equal to about 10,000 centipoise preferred, and less than or equal to about 1,000 centipoise more preferred. Also preferred is a viscosity of greater than or equal to about 1 centipoise, with greater than or equal to about 250 centipoise preferred, and greater than or equal to about 500 centipoise especially preferred.

Aqueous carrier fluids may also be used, especially those comprising hydrophilic mineral clays such as bentonite and hectorite. The aqueous carrier fluid may comprise water or water comprising a small amount of polar, water-miscible organic solvents such as methanol, ethanol, propanol, dimethyl sulfoxide, dimethyl formamide, ethylene carbonate, propylene carbonate, acetone, tetrahydrofuran, diethyl ether, ethylene glycol, propylene glycol, and the like. The amount of polar organic solvents is less than or equal to about 5.0% by volume of the total MR fluid, and preferably less than or equal to about 3.0%. Also, the amount of polar organic solvents is preferably greater than or equal to about 0.1%, and more preferably greater than or equal to about 1.0% by volume of the total MR fluid. The pH of the aqueous carrier fluid is preferably less than or equal to about 13, and preferably less than or equal to about 9.0. Also, the pH of the aqueous carrier fluid is greater than or equal to about 5.0, and preferably greater than or equal to about 8.0.

Natural or synthetic bentonite or hectorite may be used. The amount of bentonite or hectorite in the MR fluid is less than or equal to about 10 percent by weight of the total MR fluid, preferably less than or equal to about 8.0 percent by weight, and more preferably less than or equal to about 6.0 percent by weight. Preferably, the bentonite or hectorite is present in greater than or equal to about 0.1 percent by weight, more preferably greater than or equal to about 1.0 percent by weight, and especially preferred greater than or equal to about 2.0 percent by weight of the total MR fluid.

Optional components in the MR fluid include clays, organoclays, carboxylate soaps, dispersants, corrosion inhibitors, lubricants, extreme pressure anti-wear additives, antioxidants, thixotropic agents and conventional suspension agents. Carboxylate soaps include ferrous oleate, ferrous naphthenate, ferrous stearate, aluminum di- and tri-stearate, lithium stearate, calcium stearate, zinc stearate and sodium stearate, and surfactants such as sulfonates, phosphate esters, stearic acid, glycerol monooleate, sorbitan sesquioleate, laurates, fatty acids, fatty alcohols, fluoroaliphatic polymeric esters, and titanate, aluminate and zirconate coupling agents and the like. Polyalkylene diols, such as polyethylene glycol, and partially esterified polyols can also be included.

Suitable MR elastomer materials include, but are not intended to be limited to, an elastic polymer matrix comprising a suspension of ferromagnetic or paramagnetic particles, wherein the particles are described above. Suitable polymer matrices include, but are not limited to, poly-alpha-olefins and natural rubber. In some situations, formulations that may be described as MR elastomers may also fall under the definition of MR fluids, and vice versa.

The activation device 24 can be configured to deliver an activation signal to the hook elements, wherein the activation signal comprises a magnetic signal. The magnetic signal is a magnetic field. The magnetic field may be generated by a permanent magnet, an electromagnet, or combinations comprising at least one of the foregoing. The strength and direction of the magnetic field is dependent on the particular material employed for fabricating the hook element, as well as amounts and location of the material on the hook. The magnitude of the applied field strength required is the amount needed to change a shape orientation of the hooks to reduce a shear force and/or pull off force. A non-limiting example is a change in a hook shape from an inverted J-shaped orientation to a substantially straightened orientation.

Suitable magnetic flux densities for the hook elements comprised of MR fluids or elastomers range from greater than about 0 to about 1 Tesla. Suitable magnetic flux densities for the hook elements comprised of magnetic materials range from greater than about 0 to about 1 Tesla.

The loop material 18 generally comprises a random looped pattern or pile of a material. The loop material is often referred to as the "soft", the "fuzzy", the "pile", the "female", or the "carpet". Suitable loop materials are commercially available under the trademark VELCRO from the Velcro Industries B.V. Materials suitable for manufacturing the loop material include thermoplastics such as polypropylene, polyethylene, polyamide, polyester, polystyrene, polyvinyl chloride, acetal, acrylic, polycarbonate, polyphenylene oxide, polyurethane, polysulfone, metals, and the like. The loop material 18 may be integrated with the support or may be attached to the support.

The supports 16 (loop portion 12) or 20 (hook portion 14) may be rigid or flexible depending on the intended application. Suitable materials for fabricating the support include plastics, fabrics, metals, and the like. For example, suitable plastics include thermoplastics such as for example polypropylene, polyethylene, polyamide, polyester, polystyrene, polyvinyl chloride, acetal, acrylic, polycarbonate, polyphenylene oxide, polyurethane, polysulfone, and other like thermoplastic polymers. An adhesive may be applied to the backside surface of the support (the surface free from the hook elements 22 or loop material) for application of the releasable fastener system to an apparatus or structure. Alternatively, the releasable fastener system 10 may be secured to an apparatus or structure by bolts, by welding, or any other mechanical securement means. It should be noted that, unlike traditional hook and loop fasteners, both supports 16 and 20 could be fabricated from a rigid or inflexible material in view of the remote releasing capability provided. Traditional hook and loop fasteners typically require at least one support to be flexible so that a peeling force can be applied for separation of the hook and loop fastener.

The support 20 may also comprise the activation device 24 for providing the activating signal to the hook elements. For example, the support 20 may be an electromagnet for providing the magnetic signal.

While the disclosure has been described with reference to an exemplary embodiment, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular embodiment disclosed as the best mode contemplated for carrying out this disclosure, but that the disclosure will include all embodiments falling within the scope of the appended claims.

What is claimed is:

1. A releasable fastener system comprising:
   a loop portion comprising a support and a loop material disposed on a surface therein;
   a hook portion comprising a support and a plurality of hook elements disposed on a surface of the support, wherein the plurality of hook elements comprise a magnetorheological fluid, a magnetorheological elastomer, or combinations comprising at least one of the foregoing materials adapted to change a shape orientation of the hook elements upon receipt of a magnetic signal; and
   an activation device coupled to the plurality of hook elements, the activation device being operable to selectively provide the magnetic signal to the hook elements and effectuate a change in the shape orientation of the hook elements to reduce or increase a shear force and/or a pull-off force of an engaged hook and loop portion.

2. The releasable fastener system of claim 1, wherein the magnetic signal is a magnetic field.

3. The releasable fastener system of claim 1, wherein the magnetorheological elastomer comprises ferromagnetic or paramagnetic particles in ploy-alpha-olefins, natural rubber, or combinations comprising at least one of the foregoing polymeric materials.

4. The releasable fastener system of claim 1, wherein the magnetic material comprises iron, nickel, cobalt, alloys of the foregoing, or combinations comprising at least one of the foregoing.

5. The releasable fastener system of claim 1, wherein the magnetorheological fluid comprises ferromagnetic or paramagnetic particles dispersed in a carrier fluid, wherein the particles are selected from the group consisting of iron, iron alloys, iron oxides, iron nitride, iron carbide, carbonyl iron, nickel, cobalt, chromium dioxide, stainless steel, silicon steel, and combinations comprising at least one of the foregoing, and wherein the carrier fluid is selected from the group consisting of silicone oils, mineral oils, paraffin oils, silicone copolymers, white oils, hydraulic oils, transformer oils, halogenated paraffins, perfluorinated polyethers and fluorinated hydrocarbons, diesters, polyoxyalkylenes, fluorinated silicones, cyanoalkyl siloxanes, glycols, synthetic hydrocarbon oils, and combinations comprising at least one of the foregoing fluids.

6. The releasable fastener system of claim 1, wherein the loop material comprises a shape adapted to be engaged with the hook elements when the hook portion is pressed into face-to-face engagement with the loop portion.

7. The releasable fastener system of claim 1, wherein the hook elements comprise a shape comprising a J-shaped orientation, an L-shape, a mushroom shape, a knob shape, a multi-tined anchor shape, a T-shape, a spiral shape, or combinations comprising at least one of the foregoing shapes.

8. The releasable fastener system of claim 1, wherein the shape orientation of the plurality of hook elements changes from an inverted J-shaped orientation to a substantially straightened orientation upon application of the magnetic field.

9. The releasable fastener system of claim 1, wherein the magnetorheological fluid, the magnetorheological elastomer, or the combinations comprising at least one of the foregoing materials adapted to change a shape orientation of the hook elements is located at distal ends of the hook elements.

10. The releasable fastener system of claim 9, wherein the shape orientation of the plurality of hook elements changes from an inverted J-shaped orientation to a substantially inverted U-shaped orientation.

11. A process for operating a releasable fastener system, the process comprising:
    contacting a loop portion to a hook portion to form a releasable engagement, wherein the loop portion comprises a support and a loop material disposed on a surface thereon, and wherein the hook portion comprises a support and a plurality of hook elements disposed on a surface, wherein the plurality of the hook elements comprise a magnetorheological fluid, a magnetorheological elastomer, or combinations comprise at least one of the foregoing materials to change a shape orientation upon receipt of an magnetic signal;
    maintaining constant shear and pull-off forces in the releasable engagement;
    selectively introducing the magnetic signal to the hook elements, wherein the magnetic signal is effective to change a shape orientation; and
    reducing or increasing shear and/or pull off forces in the releasable engagement.

12. The process according to claim 11, wherein the hook elements comprise a shape comprising a J-shaped orientation, an L-shape, a mushroom shape, a knob shape, a multi-tined anchor shape, a T-shape, a spiral shape, or combinations comprising at least one of the foregoing shapes.

13. A hook portion for a releasable fastener system comprising:
    a support; and
    a plurality of hook elements disposed on a surface of the support, wherein the plurality of hook elements comprise a magnetorheological fluid, a magnetorheological elastomer, or combinations comprising at least one of the foregoing materials adapted to change a shape orientation upon receipt of a magnetic signal.

14. The hook portion according to claim 13, wherein the support comprises a metal, a plastic, a fabric, or a combination comprising at least one the foregoing materials.

15. The hook portion according to claim 13, wherein the hook elements comprise a shape comprising a J-shaped orientation, an L-shape, a mushroom shape, a knob shape, a multi-tined anchor shape, a T-shape, a spiral shape, and combinations comprising at least one of the foregoing shapes.

16. A process for operating a releasable fastener system, the process comprising:

providing a loop portion;

applying a magnetic signal to a hook portion, wherein the hook portion comprises a support and a plurality of hook elements disposed on a surface of the support, wherein the plurality of hook elements comprise a magnetorheological fluid, a magnetorheological elastomer, or combinations comprising at least one of the foregoing materials adapted to change a shape orientation;

contacting the hook portion with the loop portion; and discontinuing the magnetic signal to cause the hook elements and the loop material to interlock.

17. The process according to claim 16, wherein the hook elements comprise a substantially straightened shape orientation upon receiving the magnetic signal and a substantially J-shape orientation upon discontinuing the magnetic signal.

18. A releasable fastener system comprising:

a loop portion comprising a support and a loop material disposed on a surface thereon;

a hook portion comprising a support and a plurality of hook elements disposed on a surface, wherein the plurality of hook elements comprise a magnetorheological fluid, a magnetorheological elastomer, or combinations comprising at least one of the foregoing materials adapted to change a shape orientation; and means for changing the shape orientation to reduce a shear force and/or pull-off force of an engaged hook and loop portion.

19. The releasable fastener system according to claim 18, wherein the loop portion support and the hook portion support are fabricated from an inflexible material.

20. A hook portion for a releasable fastener system comprising:

a support; and a plurality of hook elements disposed on a surface of the support, wherein the plurality of hook elements comprise a magnetic material magnetorheological fluid, a magnetorheological elastomer, or combinations comprising at least one of the foregoing materials adapted to change a shape orientation upon receipt of a magnetic signal, wherein the magnetic material, the magnetorheological fluid, the magnetorheological elastomer, or the combinations comprising at least one of the foregoing materials is located at distal ends of the hook elements.

* * * * *